United States Patent
Polla et al.

(10) Patent No.: US 6,738,722 B2
(45) Date of Patent: *May 18, 2004

(54) DATA COLLECTION AND CORRECTION METHODS AND APPARATUS

(75) Inventors: Kameshwar Polla, Berkeley, CA (US); Costas J. Spanos, Lafayette, CA (US)

(73) Assignee: OnWafer Technologies, Inc., Dublin, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/126,457

(22) Filed: Apr. 19, 2002

(65) Prior Publication Data

US 2002/0177917 A1 Nov. 28, 2002

Related U.S. Application Data

(60) Provisional application No. 60/285,439, filed on Apr. 19, 2001.

(51) Int. Cl.[7] .............................. G06F 19/00; G01K 7/00
(52) U.S. Cl. ........................... 702/104; 702/85; 702/90; 702/130
(58) Field of Search ............................. 702/85, 90, 91, 702/99, 104, 130, 135; 700/108–109, 110, 117, 121; 438/14, 17; 324/750, 755, 763–765

(56) References Cited

U.S. PATENT DOCUMENTS

| | | | | |
|---|---|---|---|---|
| 5,594,328 A | * | 1/1997 | Lukaszek | 324/72 |
| 5,691,648 A | * | 11/1997 | Cheng | 324/716 |
| 5,691,921 A | * | 11/1997 | Berlin | 702/99 |
| 5,907,820 A | | 5/1999 | Pan | 702/155 |
| 5,967,661 A | * | 10/1999 | Renken et al. | 374/126 |
| 5,969,639 A | | 10/1999 | Lauf et al. | 340/870.17 |
| 5,970,313 A | * | 10/1999 | Rowland et al. | 438/17 |
| 5,989,349 A | | 11/1999 | Ke et al. | 118/728 |
| 6,033,922 A | * | 3/2000 | Rowland et al. | 438/14 |
| 6,051,443 A | | 4/2000 | Ghio et al. | 438/17 |
| 6,244,121 B1 | | 6/2001 | Hunter | 73/865.9 |

FOREIGN PATENT DOCUMENTS

WO    WO 02/17030 A2    2/2002

OTHER PUBLICATIONS

"Autonomous Micro–sensor Arrays for Process Control of Semiconductor Manufacturing Processes," Darin Fisher, Mason Freed, Kameshwar Poolla and C. J. Spanos—U.C. Berkeley, Presented: Proceedings of the 38th Conference on Decision and Control– Dec. 7–10, 1999. Presentation on Dec. 10, 1999.

"Micro–sensor Arrays for Calibration, Control, and Monitoring of Semiconductor Manufacturing Processes," Darin Fisher, Mason Freed, Kameshwar Poolla and C. J. Spanos—U.C. Berkeley, Presented: 1999 IEEE International Conference on Control Applications, Aug. 22–26, 1999. Presentation on Aug. 24, 1999.

U.S. patent application # 09/643,614, Filed on Aug. 22, 2000, Docket # AWS–002.

U.S. application # 10/126,456 Filed on Apr. 19, 2002, Docket # AWS–024.

* cited by examiner

*Primary Examiner*—Bryan Bui
(74) *Attorney, Agent, or Firm*—Larry Williams

(57) ABSTRACT

Described are methods and apparatus for collecting measured parameter data for applications such as deriving response models and information required for developing and maintaining processes and process tools. The methods and apparatus are capable of deriving correction factors for the measured data and applying the corrections factors to the measured data so as to provide corrected parameter data having increased accuracy.

29 Claims, 4 Drawing Sheets

DATA COLLECTION AND CORRECTION METHODS AND APPARATUS

CROSS-REFERENCE

The present application is related to U.S. patent application Ser. No.10/126,456 entitled "SENSOR GEOMETRY CORRECTION METHODS AND APPARATUS," filed Apr. 19, 2002, U.S. patent application Ser. No. 60/285,439 filed on Apr. 19, 2001, U.S. patent application Ser. No. 09/643,614, filed on Aug. 22, 2000 also published as Patent Corporation Treaty application WO 02/17030, and U.S. patent application Ser. No. 09/816,648, filed on Mar. 22, 2001; all of these applications are incorporated herein, in their entirety, by this reference.

TECHNICAL FIELD

This invention relates to methods and apparatus for deriving substantially correct parameter data for processing workpieces, more particularly, processing workpieces for electronic device fabrication.

BACKGROUND

The most successful processing of materials for electronic devices typically requires optimization and precise control of the processing environment at all process steps. Many of these process steps are performed under conditions that make it difficult or impossible to measure the desired process variables. In those cases where an important process variable cannot be readily measured, an attempt is made to correlate the parameter of interest to other measurable or controllable parameters. The accuracy and stability of these correlations, also called equipment response models, are a critical factor in determining the process capability and device yield at any given process step.

Descriptions of some of the available technologies and sensor apparatus for measuring process variables are available in the technical and patent literature. Examples of some of the technologies are described in United States patents U.S. Pat. Nos. 6,244,121, 6,051,443, 6,033,922, 5,989,349, 5,967,661, 5,907,820, and Patent Corporation Treaty application WO 02/17030.

Some of the available technologies are tethered systems in which sensors exposed to the process conditions that are to be measured have physical connections to remote facilities such as power sources and information processors, and electronic components. Other technologies use an electronics module that is coupled to the detectors on a support; the sensors and electronics module are part of a single unit that is exposed to the process conditions that are to be measured. The electronics module is necessary for a sensor apparatus with capabilities such as autonomous information processing capability, wireless communication capability, and other electronically controlled on-board capabilities.

In some applications, the presence of the tether or electronics module can introduce an unacceptable error in the measurement data. For the case of measuring temperatures using a sensor apparatus, the mere presence of the electronics module will distort the temperature field being measured. It is possible to reduce the distortion by using very small components in the module, thereby reducing the module's overall size and thermal mass.

Of course, for some applications the module distortion effect may be ignored if a high degree of measurement accuracy is unnecessary. However, some of the critical process steps required for processing high-value workpieces such as semiconductor wafers for electronic device and optical device fabrication and substrates for flatpanel display fabrication do indeed require high accuracy for the values of the process conditions. For such applications, measurements of a parameter such as temperature need to be extremely accurate, particularly for the temperature uniformity across the area of the workpiece. Furthermore, applications involved with the manufacture, calibration, research, and development of process equipment for processing high value substrates require high accuracy measurements since the operation of the equipment can be limited by the accuracy of the measurements. Inaccurate data can result in the loss of millions of dollars of product in some instances. Alternatively, the inaccurate data can result in the production of products having poorer performance because the process conditions were optimized based on the inaccurate data.

Clearly, there are numerous applications requiring high accuracy methods and apparatus by which spatially resolved and time resolved equipment response models can be easily and economically developed and maintained. An example of an important application is the uniform processing of workpieces such as semiconductor wafers, flatpanel displays, and other electronic devices. Furthermore, there is a need for high accuracy methods and apparatus capable of collecting data for response models in a nonperturbing manner on unmodified process equipment running realistic process conditions. Still further, there is a need for methods and apparatus capable of correcting measurements errors that can be caused by the methods and apparatus used for the measurements.

SUMMARY

This invention seeks to provide methods and apparatus that can improve the accuracy of measured parameter data used for processing workpieces. One aspect of the present invention includes methods of deriving substantially correct data for applications such as generating data for monitoring, controlling, and optimizing processes and process tools. Another aspect of the present invention includes apparatus for deriving substantially correct data for applications such as generating data for monitoring, controlling, and optimizing processes and process tools.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out aspects of the present invention. It is important, therefore, that the claims be regarded as including such equivalent constructions insofar as they do not depart from the spirit and scope of the present invention.

The above and still further features and advantages of the present invention will become apparent upon consideration of the following detailed descriptions of specific embodiments thereof, especially when taken in conjunction with the accompanying drawings.

DESCRIPTION OF THE DRAWINGS

FIG. 5b is an image of corrected temperature data derived from the measured temperatures shown in FIG. 5a.

DESCRIPTION

Figure 1:
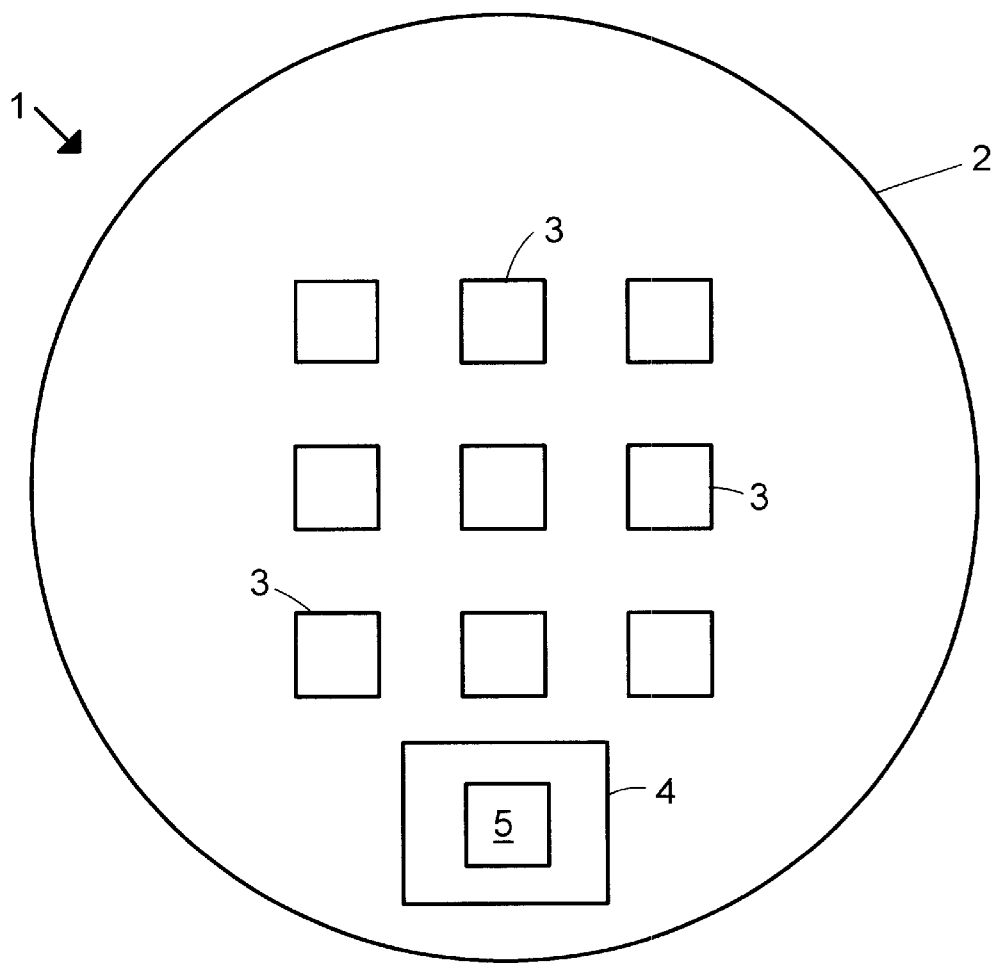
FIG. 1 is a diagram of a top view of an embodiment of the present invention.

The operation of embodiments of the present invention will be discussed below, primarily, in the context of processes for electronic device fabrication such as semiconductor wafers and flat panel displays. In addition, much of the description is presented for the application of measuring temperature as the process characteristic. However, it is to be understood that embodiments in accordance with the present invention may be used for measuring process characteristics and generating response models for essentially any processing step involving a workpiece subjected to potential temporal and/or spatial variations in process conditions. Embodiments of the present invention are not limited to the measurement of temperature nor are they limited to electronic device fabrication.

In the following description of the figures, identical reference numerals have been used when designating substantially identical elements or steps that are common to the figures.

Reference is now made to FIG. 1 wherein there is shown a block diagram for a sensor apparatus 1. Sensor apparatus 1 includes a base 2 such as a semiconductor wafer or flat panel display substrate, a sensor, preferably a plurality of sensors 3, an information processor (not shown in FIG. 1) contained in an electronics module 4, and an electronics module sensor 5. Sensors 3 and electronics module 4 are supported by base 2. Electronics module sensor 5 is coupled to electronics module 4 so as to be capable of measuring the characteristic for the electronics module 4. Sensors 3 and sensor 5 are connected with the information processor so as to allow signals generated by sensors 3 and sensor 5 to be provided as input to the information processor.

In a preferred embodiment, electronics module 4 contains the information processor and additional electronic components that may be needed for supporting the information processor. In general, the electronics module may contain a power source for the information processor. The electronics module may also contain components for transmitting and receiving information such as, for example, components for wireless communication. Preferably, the electronics module comprises a housing for containing the components of the electronics module. Optionally, the housing may be configured to provide protection for the components of the electronics module.

Descriptions of a sensor apparatus and typical components suitable for embodiments of the present invention are described in U.S. patent application Ser. No. 09/643,614, filed on Aug. 22, 2000 and also published as Patent Corporation Treaty application WO 02/17030 on Feb. 28, 2002, the contents of which are incorporated herein in their entirety by this reference.

In preferred embodiments of the present invention, base 2 is selected to be materially similar to the material of the workpieces. It is also preferable for sensor apparatus 1 to have dimensions similar to those of the workpieces. Specifically, it is desirable for sensor apparatus 1 to have dimensions similar to those of the workpiece so as to mimic the behavior of the workpiece in the process tool. It is preferable for sensor apparatus 1 to have dimensions so that sensor apparatus 1 can be loaded into the process tool using the same entry port used for loading the workpieces.

Optionally, for some embodiments of the present invention for semiconductor processing applications, base 2 comprises a semiconductor wafer. Similarly, for flatpanel display applications, base 2 may comprise a flatpanel display substrate.

Sensors 3 and sensor 5 are designed to provide an electrical signal proportional to some basic, local process parameter that is representative of the process and process tool. Examples of process parameters of importance for applications such as semiconductor processing and flatpanel display processing include temperature, etch rate, deposition rate, radio frequency (RF) field, plasma potential, thermal flux, and ion flux.

Examples of typical sensor types include: Resistor, Temperature Dependent sensors (RTD) for temperature measurement; thermistors for temperature measurement; defined area probes for measuring plasma potential and measuring ion flux; Van der Paw crosses for measuring etch rate; isolated field transistors for measuring plasma potential; and current loops for measuring ion flux and measuring RF field. The numbers and types of sensors are selected based upon the specific application and process requirements.

Some embodiments of the present invention include software. The specific software commands and structures may be dependent upon the particular hardware configuration that will use the software. In the spirit of providing a general description of the software, the following description emphasizes novel features and critical features for software embodiments of the present invention. Obvious hardware dependent generalities may not be described here unless necessary. In addition, details may not be given for well-known support algorithms such as error handling, device initialization, peripheral drivers, information transfer, timer control, and other general types of command execution.

For the case of measuring temperatures using a sensor apparatus, the mere presence of the electronics module will distort the temperature field being measured. It is possible to reduce the distortion by using very small components in the electronics module, thereby reducing module's overall size and thermal mass. In reality, the module distortion effect cannot be entirely removed.

The critical process steps required for processing high-value workpieces such as semiconductor wafers for electronic device and optical device fabrication and substrates for flatpanel display fabrication require high accuracy for the values of the process conditions. For such applications, measurements of a primary parameter such as temperature uniformity across the area of the workpiece should be extremely accurate because device yield often depends on processing uniformity. Embodiments of the present invention may be required to compensate for the measurement distortion for applications that require high accuracy for the data being sought.

Figure 2:
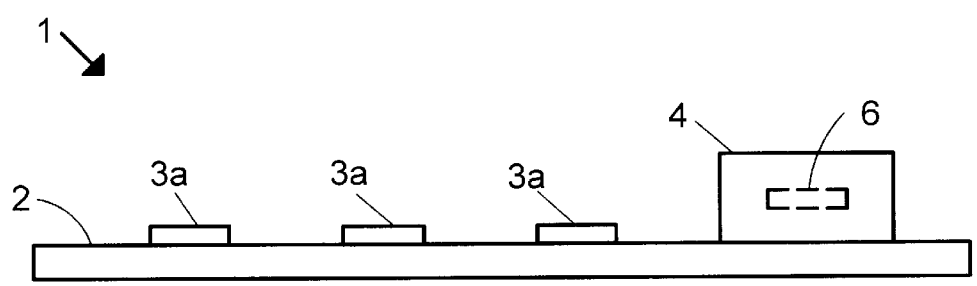
FIG. 2 is a diagram of a side view of an embodiment of the present invention.

Reference is now made to FIG. 2 wherein there is shown an embodiment of the present invention. FIG. 2 shows a side view of a sensor apparatus for measuring temperatures. The sensor apparatus includes at least one, but more preferably, a plurality of temperature sensors 3a coupled with the top surface of a base 2 comprising a silicon wafer. FIG. 2 also shows an electronics module 4 supported by base 2. Base 2 of the sensor apparatus has thickness $D_1$, which may be approximately 700 micrometers for a typical silicon wafer. In addition, the embodiment includes at least one sensor, electronics module sensor 6, disposed in electronics module 4 at a distance $D_2$ from the surface of base 2. For this embodiment, distance $D_2$ is approximately 2 millimeters. Sensor apparatus 1 can be used to measure temperatures caused by heat input or heat removal by external sources. For semiconductor processing applications, the external sources could be sources as bake plates, chill plates, ion bombardment, or exothermal chemical reactions.

The following symbols and labels will be used to describe this embodiment of the present invention:

u—externally supplied heat

T—the temperature measured on base 2 from sensors 3a

M—the temperature measured by module temperature sensor 6

R—the correct temperature on a wafer surface in the absence of module 4.

The necessary correction to the measured temperature is E=R−T. Note that T, R and E are functions of spatial position (x,y) and of time t, and that M is a function of time t. For embodiments of the present invention, the error dynamics are the differential equations that describe how E evolves in time and space.

Figure 3:
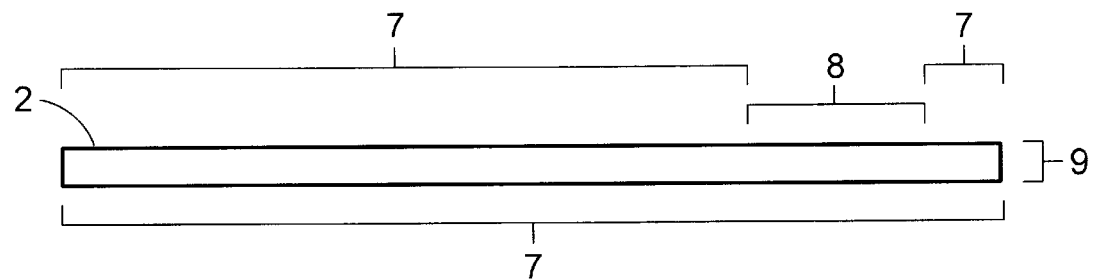
FIG. 3 is a diagram showing a side view of boundary conditions for an embodiment of the present invention.

The characteristics and behavior of the sensor apparatus can be modeled using partial differential equations that describe the time evolution and spatial flow of the measured quantities. These partial differential equations are driven by exogenous flows of the quantities of interest across the boundaries of the sensor apparatus. The boundary conditions are indicated in FIG. 3 wherein there is a shown a side view of a base 2 comprising a silicon wafer for a sensor apparatus. For the boundary conditions used to simulate these equations, it was assume that the heat loss from the edge boundary $B_3$ 9, corresponding to the area of the vertical edge of the base, of the sensor apparatus is negligible. This is because the thickness of the silicon wafer is very small in comparison with the wafer diameter. Equation (1) results from this assumption.

$$\frac{\partial R}{\partial n} = \frac{\partial T}{\partial n} = 0 \text{ at all points on the boundary } B_3 \quad (1)$$

Here n is the normal to the boundary $B_3$ 9 of the sensor apparatus. In other applications, the heat loss across boundary $B_3$ 9 may not be negligible. In these situations, and in situations where greater accuracy is desired, the edge boundary conditions will explicitly have to be taken into account.

For the sensor apparatus boundary $B_1$, identified in FIG. 3 with reference number 7, there can be heat transfer through convection and/or conduction. For the embodiment presented here, there is an assumption that the heat flow in or out through boundary $B_1$ 7 is the same in both the measured situation (where the module is present) and the ideal situation (where the module is absent).

The sensor apparatus will load the equipment controlling the heat flow and, consequently, the loading can influence the temperature field being measured. In other words, the equipment controlling the heat flow is typically designed to adjust the heat flow to the level necessary to accommodate changes in the temperature control zone. The analogous behavior also occurs for processing the workpiece. However, differences in the load to the equipment controlling the heat flow can arise because of possible dissimilarities between the sensor apparatus and the workpiece. For example, bake plates used for processing semiconductor wafers may increase or decrease the thermal input to compensate for the loading from the sensing apparatus.

For this embodiment of the present invention, the loading is assumed to be insignificant. The assumption for the present embodiment of the invention is reasonable as loading effects are very small for a properly designed sensor apparatus. Preferably, the sensor apparatus is designed to have properties similar to those of the workpiece, in this case a semiconductor wafer. Of course, a more complex model incorporating details of the process tool can be used if the loading effects are too large.

For the sensor apparatus module boundary $B_2$, indicated in FIG. 3 with reference number 8, there is a significant difference between the measured situation, with the electronics module present, and the ideal situation, without the electronics module. Typically, boundary $B_2$ 8 will correspond to the area that the electronics module (not shown in FIG. 3) is coupled to base 2. In the measured case, there will be heat flow from the module to the sensor apparatus or vice-versa. This heat flow can be modeled very well as conduction through the material of the module. For this heat flow model, the following may be needed: the thermal characteristics of the module material (specific heat c, thermal conductivity κ), module density data density ρ, and the module geometry (specifically the distance $D_2$ between the wafer surface and the location of the module temperature sensor). Using the standard heat conduction equation, the heat flow to the wafer at any point on the boundary $B_2$, indicated by reference number 8 in FIG. 3, and at any time t in the measured situation can be described as $$\alpha(M - T) \text{ where } \alpha = \frac{\rho c}{\kappa D_2} \text{ across the boundary } B_2. \quad (2)$$

This embodiment of the present invention assumes that the electronics module is homogenous and uniform. The more general case where the characteristics of the module render this approximation unacceptable is easily handled by representing α as a function of the spatial coordinates.

For the true situation where the module is absent, the heat flow to or from the sensor apparatus across the boundary $B_2$ comes from external heat sources. As a first approximation, this heat flux term u is defined to have the identical function form in both the measured situation and the ideal situation where the module is absent. The heat flux term in the measured situation has the form $$u = \beta T + v \quad (2a)$$

where v is a term that depends on temperatures of external sources such as bake/chill plate or ambient temperature, and beta T is a term that depends on the measured temperature T. In the ideal situation, the external heat flux term has the form $$u = \beta R + v \quad (2b)$$

Here, v is identical to the measured case, and R is the ideal temperature field. In both equations (2a) and (2b), the coupling coefficient beta is readily derivable from the relative geometry of the external source in relation to the measurement apparatus. Indeed, this is reasonable if the majority of heat flux to the sensor apparatus is from the bottom surface such as in the case when using bake plates in lithography process for manufacturing electronic devices. In plasma etch applications this assumption is weaker, as considerable heat fluxes flow through the top surface of the sensor apparatus.

The measured temperature T on the wafer surface can be modeled by the 2-dimensional heat equation (3).

$$\frac{\partial T}{\partial t} = c\nabla^2 T + \alpha(M - T) + \beta T + \nu \qquad (3)$$

In equation (3), c is the heat transfer coefficient of silicon, t is the time variable, and α is the thermal coupling constant between the module and the wafer as in equation (2).

The true temperature R on the wafer surface, i.e. in the ideal case where the module is absent, can be modeled by the 2-dimensional heat equation as written in equation (4) below. For this embodiment, the only source term is the externally supplied heat u, and that externally supplied heat is the same as in the actual case when the module is present above. In this case, there is no heat transfer between the module and the wafer, as the module is absent and consequently yields equation (4).

$$\frac{\partial R}{\partial t} = c\nabla^2 R + \beta R + \nu \qquad (4)$$

Defining E as the necessary correction to the measured temperature gives equation (5).

$$E = R - T \qquad (5)$$

Using equations (3) through (5) yields equation (6) for the error dynamics.

$$\frac{\partial E}{\partial t} = c\nabla^2 E + \alpha(M - T) + \beta E \qquad (6)$$

To compute the correction term, the error dynamics are simulated with the appropriate boundary conditions. This computation uses the module temperature M and the measured wafer temperature T. Derivation of the error dynamics, equation (6), and the appropriate boundary conditions (1) are important components of some embodiments of the present invention and are central components of some embodiments of the present invention.

Figure 4:
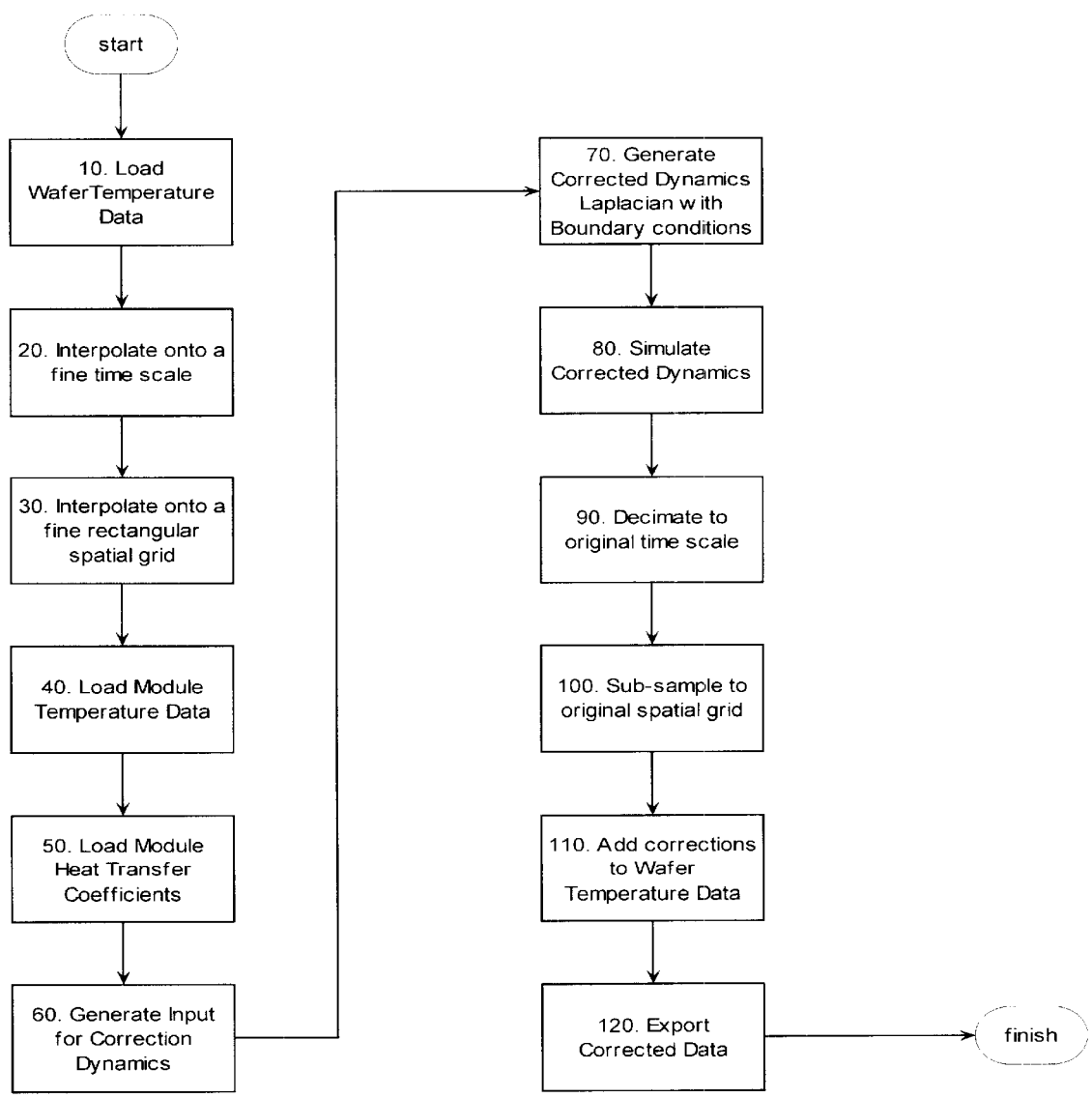
FIG. 4 is a flow chart for an embodiment of the present invention.

Reference is now made to FIG. 4 wherein there is shown a flowchart according to an embodiment of the present invention. The flowchart shown in FIG. 4 presents steps suitable for practicing an embodiment of the present invention. The first step after the start of the program is step 10.

Step 10 involves loading the measured wafer temperature data so that the data are available for calculations in an information processor such as a computer, a microprocessor, a central processing unit, and other types of information processing machines. The measured wafer temperature data typically will be in the form of measured temperatures associated with a time or time interval and a spatial location. The times or time interval will depend upon the selected rate at which the measurements are taken. The spatial location will depend upon the design of the sensor apparatus particularly the number of sensors and their location on the sensor apparatus. It is to be understood that the use of time-dependent temperature data is optional and may be preferable for some embodiments of the present invention. For other embodiments, it may be satisfactory to use temperature measurements such as temperatures measured at a fixed time or a set of temperatures that have been averaged over a time interval.

Step 20 involves interpolating the measured temperature data so as to obtain data for a fine time scale. Step 20 includes deriving intermediate temperatures corresponding to times between the time intervals of the measured temperatures. Step 30 is analogous to step 20 but step 30 involves spacing between the sensors of the sensor apparatus, which may also be referred to as a spatial grid. The intermediate temperatures may be obtained using techniques such as linear interpolation; optionally, non-linear interpolation techniques may also be used. Examples of suitable interpolation techniques include, but are not limited to, linear, spline based, distance weighted methods, kriging, and polynomial regression The type of interpolation that is used may be a matter of designer choice or the selection may be determined by the nature of the data. Preferably, the interpolation methods are selected based on the method that is most appropriate for obtaining accurate results. In some situations, step 20 and step 30 can provide the equivalent of having additional temperature measurements.

Step 20 and step 30 are optional steps that are not required for all embodiments of the present invention. In other words, the measured data can be interpolated onto a fine spatial scale and a fine temporal scale or the original time scale may be maintained throughout the calculations. In one embodiment of the present invention, interpolations were done to obtain about 10 data points for each time interval between measurements and each spacing between the spatial grid locations of the sensors. Step 20 and step 30 may be used to improve the fidelity of some embodiments of the present invention; preferred embodiments of the present invention include step 20 and step 30. The use of a rectangular grid is not required for embodiments of the present invention; nonrectangular grids may also be used. However, the rectangular spatial grid is included in the present embodiment because the rectangular spatial grid offers simplicity in addressing the data for the calculation steps.

Step 40 involves loading measured module temperature data. Embodiments of the present invention include a detector to measure the module temperature. One module temperature detector will suffice, but preferred embodiments of the invention may perform better if additional module detectors are provided. The measured module temperature data is loaded so that the data is available for calculations in the information processor such as a computer, a microprocessor, a central processing unit, and other types of information processing machines.

Step 50 involves loading module heat transfer coefficient information, α. As an option for some embodiments of the present invention, the coefficient information may be stored in the electronics module and loaded electronically, stored in an external information processor for calculating and applying the correction factors, or entered manually at a user interface. In other words, the requirement is merely to have access to the heat transfer coefficient information so that the calculations can be performed.

Step 60 involves generating input for the correction dynamics equation. More specifically, Step 60 includes computation of the term α(M-T); this is the input term that defines the error correction dynamics in equation (6). The term α(M-T) depends on time t and spatial coordinates (x,y) and is described supra.

Step 70 involves generating the corrected dynamics Laplacian for the boundary conditions. In this embodiment, the Laplacian operator $\nabla^2$ which appears in all heat transfer equations such as equation (6) is replaced by a finite differences or finite elements approximation. In this embodiment of the present invention, the appropriate boundary conditions from equation (1) are incorporated in this step. Methods of evaluating the Laplacian operator are well documented; the implementations of such methods are presented standard textbooks.

Step 80, in the embodiment of the present invention shown in FIG. 4, is where the error dynamics equation (6) is simulated together with the boundary conditions from equation (1). This is a standard partial differential equation simulation. One embodiment of the present invention implements a finite differences solver using the forward Euler method. There are numerous alternatives available that can be used in other embodiments of the present invention; some of alternatives are discussed below. The output of the simulation will be the correction term E.

Step 90 is related to step 20. Specifically, step 90 involves decimating the correction term E in time so as to return from the fine time scale back to the measured time scale, i.e., the original time scale. This means selecting from the correction terms calculated for the fine time scale only those correction terms corresponding to the times of the measured temperatures. In other words, the correction terms for the temperatures obtained for the fine time scale by interpolation of the time scale are discarded. Only the correction terms corresponding to the time scale for the measured temperatures are retained so that there is only a correction term for the measured temperatures.

Step 100 is related to step 30. Specifically, step 100 involves sub-sampling the correction term E spatially so as to return from the fine spatial grid back to the measured spatial grid, specifically, the original spatial grid. This means selecting from the correction terms calculated for the fine spatial grid only those correction terms corresponding to the spatial coordinates of the measured temperatures. In other words, the correction terms for the temperatures obtained for the fine spatial grid by interpolation of the spatial grid are discarded. Only the correction terms corresponding to the spatial grid for the measured temperatures are retained so that there is only a correction term for the measured temperatures.

Step 90 and step 100 are optional steps that are only needed for embodiments of the present invention that also include the previously described related step 20 and step 30, respectively. In other words, embodiments of the present invention that do not include step 20 will not need step 90. Similarly, embodiments of the present invention that do not include step 30 will not need step 100.

Step 110 includes adding the correction term E to the measured sensor apparatus temperatures so as to obtain the corrected temperatures The corrected temperatures are more accurate in representing the temperatures that would be experienced by a workpiece for the same process conditions experienced by the sensor apparatus.

Step 120 involves exporting the corrected data. In essence, step 120 involves making the corrected data available to a user. As an example, the corrected data may be made available by sending it to a printer. Alternatively, the data may be sent to some other form of display such as an electronic display.

The flowchart shown in FIG. 4 is but one embodiment of the present invention. It will be cleared to those skilled in the art that the steps of the embodiment shown in FIG. 4 can be altered so as to obtain other embodiments of the present invention. Furthermore, even the order in which some of the steps are executed can be altered so as to obtain other embodiments of the present invention.

The steps of the flowchart can be implemented as software code using standard computer programming techniques. As is known to those skilled in the art, a variety of programming languages can be used for implementing the flowchart shown in FIG. 2. Examples of languages that are suitable include C, C++, Fortran, Mathematica, MATLAB, and BASIC. Optionally, the software may be broken up into multiple files for easier readability. The software may employ subroutines for performing particular actions and commands.

Figure 5A:
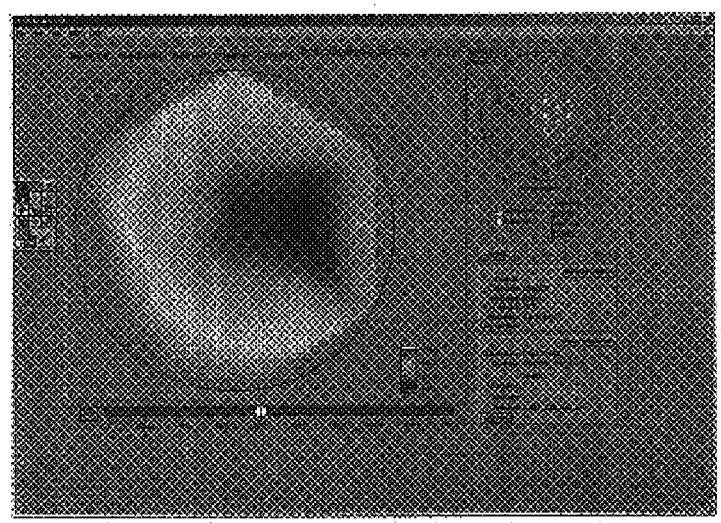
FIG. 5a is an image of temperatures measured using a sensor apparatus before correction.

Reference is now made to FIG. 5*a* wherein there is shown a screen capture of a computer display showing measured temperature data for a sensor apparatus. The sensor apparatus for the data shown in FIG. 5*a* includes a base comprising a silicon substrate, 42 temperature sensors comprising thermistors contacting the substrate, and one module sensor comprising a thermistor. The sensor apparatus includes an electronics module for controlling the data collection. The electronics module is mounted on the base of the sensor apparatus. The sensor apparatus is essentially the same as that described for FIG. 1. The temperature for the process conditions being measured was at approximately 115 Celsius.

The temperature data presented in FIG. 5*a* are in the form of a contour plot surrounded by a circle, where the circle represents the edge of the base of the sensor apparatus. The light and dark areas of the image represent different temperatures; specifically the dark areas represent cooler temperatures than the light areas. FIG. 5*a* has a clearly discernible dark area. The location of the dark area corresponds to the location of the electronics module on the base of the sensor apparatus. This means that the presence of the electronics module alters the measured temperatures. For this particular case, the temperatures measured proximate to the electronics module are lower than the temperatures measured further away from the electronics module. The presence of the module produced a distortion in the temperature measurements shown in FIG. 5*a* on the order of about 10 degrees Celsius.

Figure 5B:
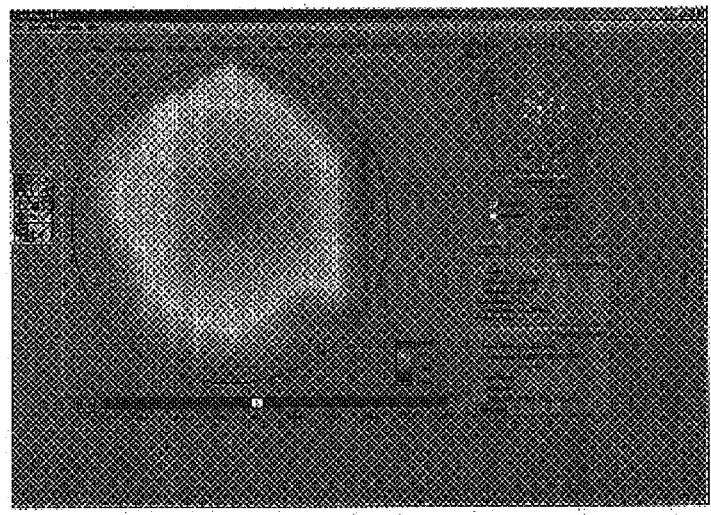

The temperature data shown in FIG. 5*b* was derived from applying embodiments of the present invention to the data presented in FIG. 5*a*. Specifically, the data presented in FIG. 5*a* were corrected using a method according to an embodiment of the present invention to obtain the data presented in FIG. 5*b*. The data presented in FIG. 5*b* does not show the dark area representing the cooler temperatures caused by the presence of the electronics module. In other words, the data from FIG. 5*a* were corrected so as to obtain temperature data that more correctly represents the temperature of a workpiece exposed to the same process conditions as the sensor apparatus. The effect of the presence of the module has been removed, and the cylindrically symmetric pattern of temperatures that should be expected in the absence of the module is clearly evident. Using embodiments of the present invention, the distortion caused by the presence of the electronics module was removed so that the derived temperature data was within an estimated accuracy of 0.2 degrees Celsius of the temperature without the presence of the electronics module. Consequently, the date presented in FIG. 5*b* represents the temperatures of a silicon wafer exposed to substantially the same process conditions that were measured by the sensor apparatus.

Embodiments of the present invention can allow the derivation of highly accurate data from data measured with a non-ideal sensor apparatus. In other words, embodiments of the present invention allows the derivation of substantially correct temperature distributions over time and space for a workpiece in a manufacturing process that is substantially un-perturbed by the sensor apparatus.

Embodiments of the invention are particularly suited to applications such as characterizing bake plates used for heating semiconductor wafers and characterizing plasma chambers for processing semiconductor wafers. Embodiments of the present invention can allow such characterizations substantially without artifacts obscuring the behavior of the process. Embodiments of the present invention can be used to expand the characterization of process operations to real-time, transient behavior, and thus making the characterization much more relevant to the processing of actual workpieces such as semiconductor wafers for electronic devices and flatpanel display substrates for flatpanel displays.

As a specific example, embodiments of the present invention can allow determination of the behavior of photoresist under precisely measured transient process conditions such as process steps involving heat transfer. The information gained using embodiments of the present invention can be used to optimize the overall process for manufacturing products such as electronic devices. Embodiments of the present invention provide opportunities for determining and controlling critical parts of processes and process conditions used in the production of high-value products. The standard technologies have been incapable of providing such opportunities without severe impracticalities.

Embodiments of present invention can be used to accurately identify workpiece temperature nonuniformities that may occur in electronic device manufacturing processes. Imperfections in components that are part of semiconductor process tools, components such as bake plates and such as plasma chamber chucks, can be localized using embodiments of the present invention. Embodiments of the present invention can be used to analyze the transient temperature behavior of workpieces and thus to determine the impact of the imperfections on the process results for the workpiece. Using embodiments of the present invention, high accuracy data can be used to identify localized temperature problems under or over the workpiece.

Embodiments of the present invention can also be used to obtain increased accuracy in "matching" process tools such as semiconductor wafer processing tools and flatpanel display processing tools. For some technologies, this methodology is referred to as chamber matching. Specifically, it is typically preferable for multiple process chambers performing the same process to provide substantially the same process results. This means that each chamber needs to produce substantially the same process conditions for workpieces. The high accuracy information that can be obtained using embodiments of the present invention allows for greater accuracy for chamber matching. In addition, embodiments of the present invention make it easier to incorporate steady state information and transient information in the chamber matching methodologies. Embodiments of the present invention can be used to help perform a much more meaningful and more accurate comparison of process chamber behavior across the entire time trajectory of the process step.

Embodiments of the present invention can be used to correct sensor measurements by compensating for the presence of a variety of artifacts in the sensor apparatus. Measurement errors caused by caused material differences can be corrected using embodiments of the present invention. If a sensor apparatus is being used for measurements and the sensor apparatus comprises materials that are dissimilar to the materials of the workpiece for which the information is being gathered, then embodiments of the present invention can be used to derive corrected temperatures that represent the temperature of the workpiece experiencing the same process conditions. As a specific example, if the sensor apparatus comprises a ceramic having significantly different thermal characteristics from that of silicon, the corrected temperatures for a silicon wafer, i.e., the workpiece, can be obtained using embodiments of the present invention.

In the example given earlier, embodiments of the present invention were used to correct measurement errors caused by the presence of an electronics module included with the sensor apparatus. Other embodiments of the present invention can be used to provide corrected data for sensor apparatus having a tethered connection. For some applications, the presence of the tether can distort the measurements obtained using the sensor apparatus. Temperature measurements using a tethered temperature sensor may have errors because the tether alters the heat transfer characteristics of the sensor apparatus. However, the workpiece does not have a tether and does not have heat transfer characteristics that are affected by a tether. In other words, the presence of the tether distorts the temperature field being measured, but embodiments of the present invention can compensate for this distortion and derive corrected temperature values that more accurately indicate the temperature of the workpiece.

The example given earlier describes the use of a sensor apparatus having a single electronics module. However, in some applications it may be necessary to have several electronics modules included with the sensor apparatus so as to achieve very high spatial resolution of the parameter measurements. In other words, high-resolution temperature measurements may require a large number of temperature sensors. Handling information from the large number of temperature sensors may require the use of multiple electronics modules. Embodiments of the present invention may also include use of a sensor apparatus having multiple electronics modules. The implementation of embodiments of the present invention for use with a sensor apparatus having multiple electronics modules is substantially analogous to that described for implementation with a single electronics module.

For some applications of embodiments of the present invention, there may be circumstances in which it is necessary to protect at least a portion of the sensor apparatus from the measurement environment. Some techniques that can be used to provide the protection include techniques such as engineering barrier layers, providing protective coverings, and other methods. As a consequence of serving those applications, it may be necessary to use materials and geometries for which the thermal characteristics, such as conductivity, density, specific heat, directly distort the temperature field being sensed. Embodiments of the present invention are suitable for obtaining temperature measurements that are corrected for the distortion caused by the materials and geometries required for protecting the sensor apparatus.

Embodiments of the present invention can be used for a wide variety of types of parameter measurements. On a fundamental level, a sensor apparatus is used to measure physical attributes of importance such as induced plasma potential, etch rates, ion densities, and others for developing, analyzing, maintaining, and repairing process tools for processing workpieces. The design of the sensor apparatus will typically involve using components that are not directly part of the sensing function per se. These components may include electronics modules for power, signal processing, and communications, physical barrier layers, protective overcoats, non-standard materials etc. In each of these cases, the components extraneous to the immediate sensing need can distort the measurements. Embodiments of the present invention can be used to compensate for this distortion and deduce corrected sensor measurements.

Examples of typical sensor types that are suitable for use with embodiments of the present invention include: Resistor, Temperature Dependent sensors (RTD) for temperature measurement; thermistors for temperature measurement; defined area probes for measuring plasma potential and measuring ion flux; Van der Paw crosses for measuring etch rate; isolated field transistors for measuring plasma potential; and current loops for measuring ion flux and measuring RF field.

Additional embodiments of the present invention may include one or more of following options. For some embodiments of the present invention, the error dynamics partial differential equation can be discretized using a number of standard methods such as finite elements or finite difference. The resulting discretized system of equations could be simulated to compute the correction using many techniques such as backward Euler, forward Euler, and other techniques. In addition, various time and space step sizes could be used. As yet another option, a variety of spatial interpolation algorithms could be used to interpolate the measured wafer temperatures onto a finer spatial grid. Embodiments of the present invention may also include the incorporation of additional module sensors so as to improve the accuracy of the corrected data.

Another embodiment of present invention is an apparatus for acquiring corrected data for monitoring, controlling, and optimizing processes and process tools. The apparatus includes a substrate and at least one substrate sensor supported by the substrate for measuring a parameter of the substrate. The apparatus further includes an electronics module supported by the substrate and an electronics module senor arranged for measuring the parameter for the electronics module. The electronics module includes an information processor connected with the substrate sensor and with the electronics module sensor so that information from the sensors can be provided to the information processor. The electronics module also includes an internal communicator. The internal communicator is connected with the information processor so that the information processor can provide information to the internal communicator. The internal communicator is capable of transmitting information received from the information processor. The electronics module further includes a power source. The power source is connected so as to provide power to at least one of: the information processor, the internal communicator, and the sensor. Preferably, the electronics module also includes a housing for containing the components of the electronics module. Optionally, the housing may be configured to provide protection for the components of the electronics module, particularly, protection from severe process conditions. Examples of severe process conditions include but are not limited to the presence of corrosive reagents such as reactive gases or plasmas, electromagnetic radiation, high or low temperatures, and high or low pressures.

In a preferred embodiment of the present invention, a method is carried out using a sensor apparatus that has information processing capabilities for correcting measurement errors caused by the sensor apparatus. The method includes the steps of loading the sensor apparatus into the process tool, using the sensor apparatus to measure data representing a performance characteristic of the process tool, deriving correction factors for the measurements, and applying the correction factors to the measured data so as to provide substantially correct data. The method further includes converting the measured operating characteristics into digital data using the sensor apparatus. For this embodiment of the present invention, the sensor apparatus includes embedded software for operating the sensor apparatus in addition to the software for calculating the correction factors and applying the correction factors to the measured data. This means that the software may be arranged to be capable of operating from within the process environment that is being characterized by the sensor apparatus as well as outside of the process environment. In addition, the method includes performing at least one step of storing the digital data in the sensor apparatus and transmitting the digital data to a receiver.

Alternatively, embodiments of the present invention may include a system for collecting and correcting parameter measurements. The system includes a sensor apparatus for collecting measurement data and includes an external information processor. Examples of suitable external information processors include information processors such as a microprocessor, a central processing unit, and a computer. The external information processor is configured so as to be capable of generating the correction factors and applying the correction factors to the measured data so as to obtain corrected measurement data. The system also includes a communication mechanism for transmitting information between the sensor apparatus and the external information processor. Examples of suitable communication mechanisms are mechanisms that may include wireless communication devices, electrical communication cables, and optical fibers. The system is arranged so that the measurement data from the sensor apparatus can be provided as input to the external information processor. A preferred embodiment of the present invention includes wireless communication devices that use infrared technology for information transfer.

Clearly, embodiments of the present invention can be used for a wide variety of applications that require data acquisition for development, optimization, monitoring, and control of processes and process tools used for processing workpieces. Capabilities and features of embodiments of the present invention are particularly suited for processing high-value workpieces such as semiconductor wafers and flat panel displays.

FIG. 4 represents flowcharts and control flow illustrations of methods, systems, and program products according to the invention. It will be understood that each step of the flowchart and control flow illustrations, and combinations thereof can be implemented by computer program instructions. These computer program instructions may be loaded onto a computer or other programmable apparatus to produce a machine, such that the instructions that execute on the computer or other programmable apparatus create means for implementing the functions specified in the flowchart. These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart. The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowchart.

Accordingly, steps of the flowchart or control flow illustrations support combinations of means for performing the specified functions, combinations of steps for performing the specified functions and program instruction means for performing the specified functions. It will also be understood that each block or step of the block diagram, flowchart or control flow illustrations, and combinations of blocks or steps in the block diagram, flowchart or control flow illustrations, can be implemented by special purpose hardware-based computer systems which perform the specified functions or steps, or combinations of special purpose hardware and computer instructions.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

While there have been described and illustrated specific embodiments of the invention, it will be clear that variations in the details of the embodiments specifically illustrated and described may be made without departing from the true spirit and scope of the invention as defined in the appended claims and their legal equivalents.

What is claimed is:

1. A method of deriving operating characteristics for a process tool used for processing workpieces the method being performed with a sensor apparatus having a plurality of detectors, the method comprising the steps of:
    a) loading a sensor apparatus including electronic devices into the process tool;
    b) measuring the operating characteristics with the sensor apparatus;
    c) converting the measured operating characteristics into digital data;
    d) deriving correction factors for the measurements; and
    e) applying the correction factors to the measured data so as to generate corrected data.

2. A method according to claim 1 further comprising at least one step of:
    i. storing the digital data in the sensor apparatus,
    ii. transmitting the digital data to a receiver, and
    iii. storing the digital data in the sensor apparatus and transmitting the digital data to a receiver.

3. A method of deriving operating characteristics for a process tool used for processing workpieces the method being performed with a sensor apparatus having a plurality of detectors, the method comprising the steps of:
    a) loading a sensor apparatus including electronic devices into the process tool;
    b) measuring the operating characteristics with the sensor apparatus;
    c) converting the measured operating characteristics into digital data;
    d) deriving correction factors for the measurements; and
    e) applying the correction factors to the measured data so as to generate corrected data;
wherein step d comprises solving analytically generated equations representing the behavior of at least a portion of the sensor apparatus.

4. A method according to claim 3 wherein step d includes using the equations and measurements from at least one of the sensors so as to derive the correction factors.

5. A method according to claim 3 wherein the sensor apparatus solves the equations.

6. A method according to claim 3 wherein the operating characteristics are temperatures.

7. A method according to claim 3 wherein the operating characteristics are selected from the group consisting of plasma potential, etch rate, deposition rate, ion density, resistivity, and thermal flux.

8. A method according to claim 3 further comprising the step of transmitting the measured operating characteristics to an external information processor for deriving the correction factors and applying the correction factors to the measured operating characteristics.

9. An apparatus for generating corrected data for process tools used for processing workpieces, the apparatus comprising:
    a base;
    at least one base sensor supported by the base, the sensor being capable of measuring data representing a condition of the base;
    an electronics module comprising an information processor, the electronics module being supported by the base;
    at least one electronics module sensor coupled to the electronics module for measuring data representing a condition of the electronics module; and
    the information processor being connected with the base sensor and the electronics module sensor so as to receive data from the sensors.

10. An apparatus according to claim 9 wherein the electronics module further comprises a transmitter for transmitting data.

11. An apparatus according to claim 9 wherein the electronics module further comprises a transmitter for wirelessly transmitting data.

12. An apparatus according to claim 9 wherein the base sensor comprises a temperature sensor and the electronics module sensor comprises a temperature sensor.

13. An apparatus according to claim 9 wherein the base sensor and the electronics module sensor comprises at least one of resistor temperature dependent sensors, thermistors, defined area probe for measuring plasma potential, defined area probe for measuring ion flux, Van der Paw cross for measuring etch rate, isolated field transistors for measuring plasma potential, current loops for measuring ion flux, and current loops for measuring radio frequency field.

14. An apparatus according to claim 9 wherein the information processor is capable of calculating correction factors using at least one characteristic of the electronics module and data from the information processor sensor; the information processor being capable of applying the correction factors to the measured parameters from the base sensor so as to obtain corrected data for the parameters.

15. An apparatus according to claim 14 wherein the electronics module further comprises a transmitter for transmitting the corrected data.

16. An apparatus according to claim 14 wherein the electronics module further comprises a transmitter for wirelessly transmitting the corrected data.

17. An apparatus according to claim 14 wherein the electronics module is capable of at least one of
    a) storing the corrected data, and
    b) storing the corrected data and transmitting the corrected data.

18. An apparatus according to claim 14 wherein the base sensor comprises a temperature sensor and the electronics module sensor comprises a temperature sensor.

19. An apparatus according to claim 14 wherein the base sensor and the electronics module sensor comprises at least one of resistor temperature dependent sensors, thermistors, defined area probe for measuring plasma potential, defined area probe for measuring ion flux, Van der Paw cross for measuring etch rate, isolated field transistors for measuring plasma potential, current loops for measuring ion flux, and current loops for measuring radio frequency field.

20. An method of deriving corrected parameter data for a uniform workpiece using parameter measurements from a sensor apparatus having a first portion and a second portion, the first portion and the second portion having dissimilar properties, the workpiece and the first portion having substantially similar properties, the method comprising the step of:
   a) coupling at least one detector with the first portion of the sensor apparatus, the first portion having substantially uniform properties;
   b) coupling at least one detector with the second portion of the sensor apparatus, the second portion having substantially uniform properties;
   c) measuring the parameter using the at least one detector of step a;
   d) measuring the parameter using the at least one detector of step b;
   e) providing at least one property of the second portion of the sensor apparatus;
   f) providing at least one equation for substantially representing the behavior of the second portion as a function of the parameter;
   g) using the equation and parameter measurements for the second portion to derive correction factors; and
   h) applying the correction factors to the measured parameters so as to obtain the corrected parameter data.

21. A method of deriving corrected parameter data for a substantially uniform workpiece using parameter measurements from a sensor apparatus, the workpiece and at least a portion of the sensor apparatus having dissimilar properties, the method comprising the steps of:
   a) coupling at least one detector with a first portion of the sensor apparatus, the first portion having substantially uniform properties, the first portion having properties substantially similar to the properties of the workpiece;
   b) coupling at least one detector with a second portion of the sensor apparatus, the second portion having substantially uniform properties, wherein the properties of the workpiece and the properties of the second portion are dissimilar;
   c) measuring the parameter using the at least one detector of step a;
   d) measuring the parameter using the at least one detector of step b;
   e) providing at least one property of the second portion of the sensor apparatus;
   f) providing at least one equation for substantially representing the behavior of the second portion as a function of the parameter;
   g) using the equation of step f and parameter measurements for the second portion to derive correction factor; and
   h) applying the correction factors to the measured parameters so as to obtain the corrected parameter data.

22. An apparatus for generating corrected temperature data for processing substrates in a process tool, the apparatus comprising:
   a base;
   at least one base temperature sensor coupled to the base, the at least one base temperature sensor being capable of measuring the temperature of the base;
   an electronics module supported by the base, the electronics module having an information processor;
   at least one electronics module temperature sensor coupled to the electronics module, the at least one electronics module temperature sensor being capable of measuring the temperature of the electronics module;
   the information processor being connected with the base temperature sensor and the electronics module temperature sensor so as to receive temperature data from the at least one base temperature sensor and the at least one electronics module sensor, the information processor being capable of calculating correction factors using at least one thermal conductivity characteristic of the information processor and the temperature data from the information processor temperature sensor; the information processor being capable of applying the correction factors to the measured temperatures from the at least one base temperature sensor so as to obtain corrected temperature data.

23. An apparatus according to claim 22 wherein the base comprises a semiconductor wafer.

24. An apparatus according to claim 22 wherein the base comprises a flat panel display substrate.

25. A computer program product for correcting temperatures measured with a sensor apparatus, the sensor apparatus comprising a semiconductor wafer, a plurality of temperature sensors coupled to the wafer, an electronics module supported by the wafer, and a temperature sensor coupled to the electronics module, the computer program product comprising executable steps for:
   a) acquiring measured wafer temperature data as a function of time and spatial position;
   b) generating additional data by interpolation using the measured wafer temperature data so as to obtain temperatures for least one of a fine time scale and a fine spatial grid scale;
   c) acquiring measured electronics module temperature data;
   d) calculating temperature correction factors using heat transfer coefficients for the electronics module and the measured electronics module temperature data;
   e) reducing the correction factors of step d to at least one of the time scale of the measured temperatures and the spatial grid scale of the measured temperatures so as to correspond to step b; and
   f) applying the correction factors to the measured wafer temperature data so as to provide corrected temperatures.

26. A system for collecting and correcting parameter measurements, the system comprising a sensor apparatus for collecting parameter measurements for correction and collecting parameter measurements for generating correction factors, the sensor apparatus comprising a base, at least one base sensor supported by the base, an electronics module comprising an information processor, the electronics module being supported by the base, at least one electronics module sensor coupled to the electronics module for measuring data representing a condition of the electronics module, the information processor being connected with the base sensor and the electronics module sensor so as to receive data, an external information processor, and a communication mechanism for transmitting information between the sensor apparatus and the external information processor, the external information processor being capable of generating correction factors using the parameter measurements for generating correction factors for correcting the parameter measurements and applying the correction factors to the parameter measurements for correction so as to obtain corrected parameter measurements data.

27. A system according to claim 26 wherein the communication mechanism is capable of wireless information transfer.

28. A system according to claim 26 wherein the communication mechanism is capable of wireless information transfer using the infrared spectrum.

29. A system according to claim 26 wherein the external information processor comprises at least one of a microprocessor, a central processing unit, and a computer.

* * * * *

UNITED STATES PATENT AND TRADEMARK OFFICE
CERTIFICATE OF CORRECTION

PATENT NO. : 6,738,722 B2
DATED : May 18, 2004
INVENTOR(S) : Kameshwar Poolla and Costas J. Spanos It is certified that error appears in the above-identified patent and that said Letters Patent is hereby corrected as shown below:

Title page,
Item [75], Inventors, change "Polla" to -- Poolla --.
Item [56], References Cited, OTHER PUBLICATIONS, change "Docket # AWS-002." to -- Docket # AWS-001. --

Column 8,
Line 13, change "...and polynomial regression The type of interpolation that is..." to -- ...and polynomial regression. The type of interpolation that is... --

Column 9,
Line 49, change "...corrected temperatures The corrected temperatures are more..." to -- ...applying corrected temperatures. The corrected temperatures are more... --

Column 13,
Line 36, change "senor arranged for measuring..." to -- sensor arranged for measuring... --

Column 17,
Line 12, change "An method of deriving corrected parameter data" to -- A method of deriving corrected parameter data... --

Signed and Sealed this

Nineteenth Day of October, 2004

JON W. DUDAS
*Director of the United States Patent and Trademark Office*